United States Patent [19]

Yamazaki et al.

[11] Patent Number: 5,017,264

[45] Date of Patent: May 21, 1991

[54] METHOD OF ELIMINATING CARBON MATERIAL BY CHEMICAL VAPOR REACTION

[75] Inventors: Shunpei Yamazaki, Tokyo; Kenji Itoh, Zama, both of Japan

[73] Assignee: Semiconductor Energy Laboratory Co., Ltd., Kanagawa, Japan

[21] Appl. No.: 582,769

[22] Filed: Sep. 14, 1990

Related U.S. Application Data

[62] Division of Ser. No. 324,663, Mar. 17, 1989, Pat. No. 4,975,144.

[30] Foreign Application Priority Data

Mar. 22, 1988 [JP] Japan .................................. 63-67573
Mar. 22, 1988 [JP] Japan .................................. 63-67574
Mar. 26, 1988 [JP] Japan .................................. 63-72891

[51] Int. Cl.$^5$ .................... B44C 1/22; C03C 15/00; C03C 25/06
[52] U.S. Cl. .................................... 156/643; 156/646; 156/659.1; 156/655; 252/79.1; 204/192.35
[58] Field of Search .............. 156/643, 646, 655, 656, 156/659.1, DIG. 68, 345; 252/79.1; 427/38, 39; 204/192.32, 192.35, 298; 118/50.1, 620

[56] References Cited

U.S. PATENT DOCUMENTS 4,053,350 10/1977 Olsen et al. ...................... 156/659.1
4,620,898 11/1986 Banks et al. ........................ 156/643
4,816,113 3/1989 Yamazaki ........................... 156/643

*Primary Examiner*—William A. Powell
*Attorney, Agent, or Firm*—Sixbey, Friedman, Leedom & Ferguson

[57] ABSTRACT

An etching method for eliminating carbon material is described. After disposing a substrate to be treated in a CVD reaction chamber, $NF_3$ is admitted to the chamber and converted into a plasma etchant comprising fluorine ions or radicals by inputting high frequency energy. The carbon material elimination can be applied for chamber cleaning so as to removing carbon deposited debris from the inside of the chamber.

4 Claims, 9 Drawing Sheets

METHOD OF ELIMINATING CARBON MATERIAL BY CHEMICAL VAPOR REACTION

This is a divisional application of Ser. No. 07/324,663, filed Mar. 17, 1989, now U.S. Pat. No. 4,975,144.

BACKGROUND OF THE INVENTION

This invention relates to a method of eliminating carbon material by chemical vapor reaction.

Recently, a process for forming carbon films having a very high hardness has been developed utilizing chemical vapor reactions. An example is described in Japanese Patent Application No. sho56-146936 filed on Sept. 17, 1981. Carbon films of this type are very useful due to their high hardness providing a smooth and corrosion-proof surface. These advantages, however, make etching become difficult on the other hand, while etching process is very important particularly in the semiconductor device manufacture.

Particularly, when a substantial thickness of carbon coating is deposited on a substrate, the inside surface of the reaction chamber and the substrate holder are also covered with the carbon material. The carbon material tends to fall as flakes onto the surface of the substrate to be coated and make the substrate inacceptible.

SUMMARY OF THE INVENTION

It is therefore an object of the invention to provide an improved carbon etching method.

In order to accomplish the above and other objects and advantages, it is proposed to utilize an etchant gas comprising fluorine such as $NF_3$ in order to etch carbon material. The fluorine etchant can vaporize the carbon material in accordance with the following equation.

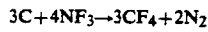

$$3C + 4NF_3 \rightarrow 3CF_4 + 2N_2$$

The two substances in the right side of the above equation are gaseous. This can be applied for either cleaning of the inside of a chamber or patterning of the carbon film.

DETAILED DESCRIPTION OF THE PREFERRED EMBODIMENTS

Figure 1A:
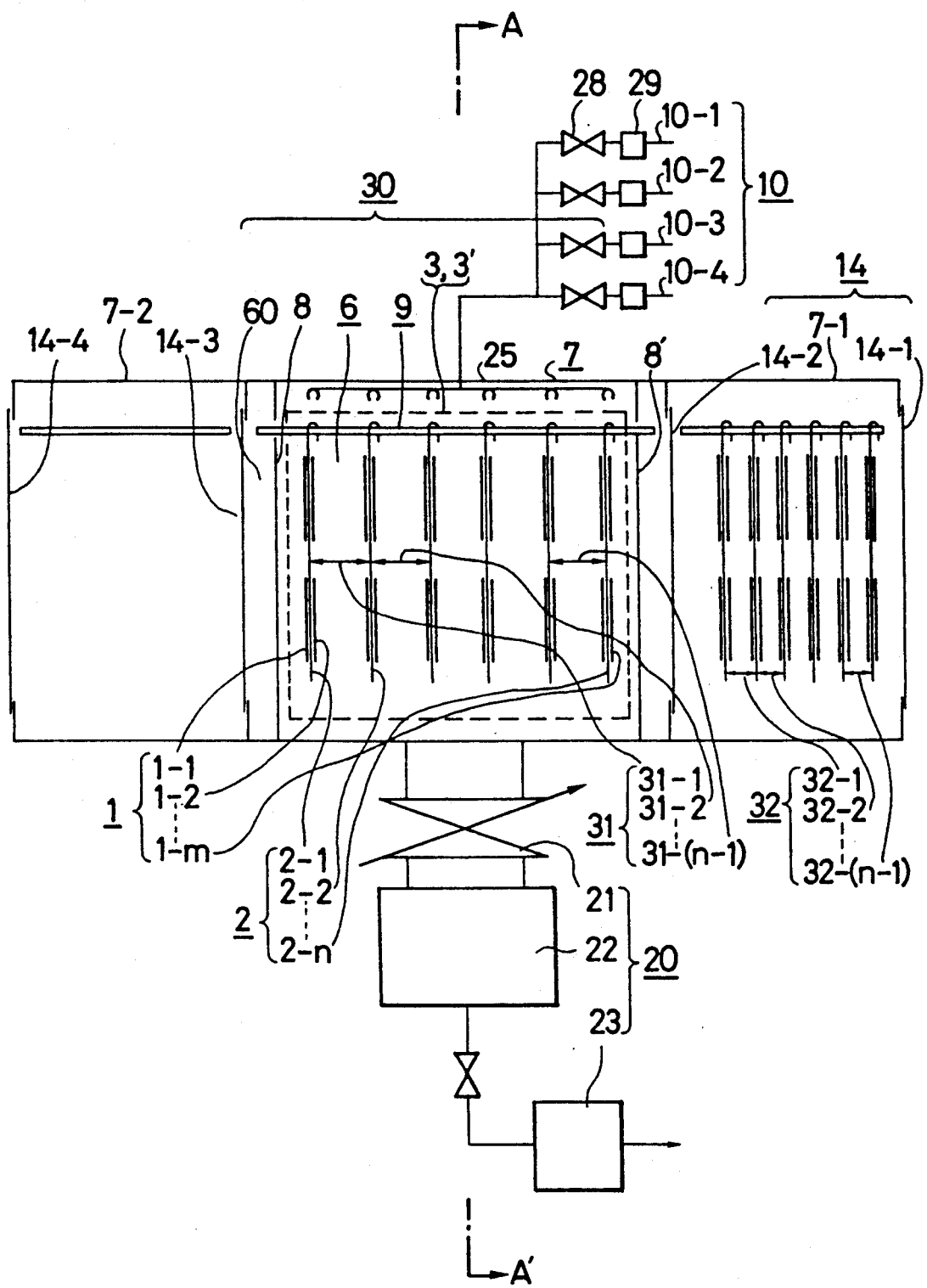
FIG. 1(A) is a cross section view showing a plasma CVD apparatus in accordance with the present invention.
Figure 1B:
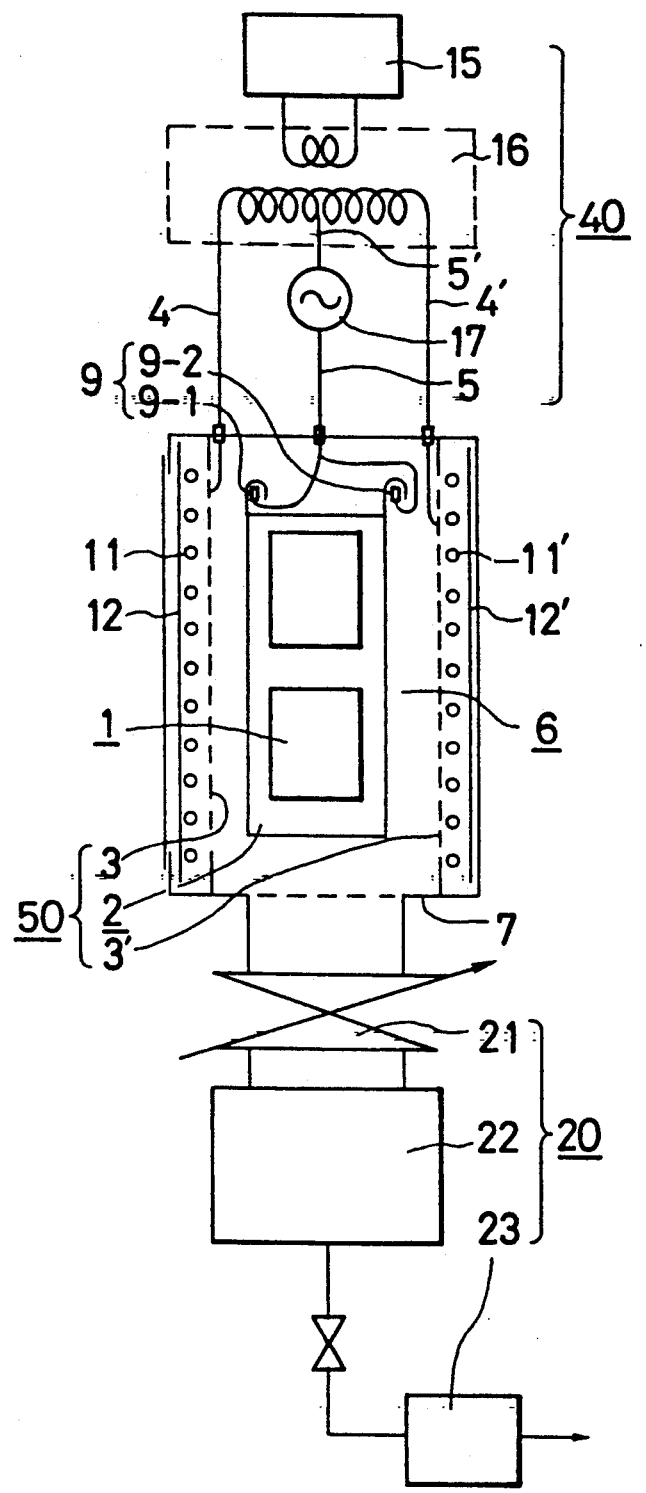
FIG. 1(B) is cross section views taken along A—A line of FIG. 1(A).

Referring to FIGS. 1(A) and 1(B), a plasma CVD apparatus in accordance with the present invention will be described. A large size plasma treatment system comprises a reaction chamber 7 provided with a loading chamber 7-1, an unloading chamber 7-2, a pair of guide rails 9 for suspending therefrom a plurality of substrate holders 2 made of aluminium or nickel plates, a high frequency electric power source 15 for supplying an electric power through a matching transformer 16, first and second metallic mesh electrodes 3 and 3' connected to the output terminals 4 and 4' of the transformer 16, the geometric area of each electrode being 150 $cm^2$ and the effective area of each electrode being 120 $cm^2$, an alternating electric power source 17 connected between the midpoint of the secondary coil of the transformer and the guide rails 9, a gas feeding system 10 consisting of four passages each of which is provided with a flow meter 29 and a valve 28, a nozzel 25 for inputting gases to the reacion chamber 7 from the gas feeding system 10, and an exhausing system 20 including a pressure control valve 21, a turbo molecular pump 22 and a rotary pump 23. A reaction space is defined within the reaction chamber by a four-sided hollow structure 8 and 8' of 160 cm width, 40 cm depth and 160 cm height for blocking deposition on the inside wall of the reaction chamber 7. The height of the hollow structure may be chosen between 20 cm and 5 m in general. One dimmension of the electrodes 3 and 3' may be chosen between 30 cm and 3 m in general. There are provided gate valves 14-1 and 14-4 between the outside and the loading and unloading chambers 7-1 and 7-2 and gate valves 14-2 and 14-3 between the reaction chamber 7 and the loading and unloading chambers 7-1 and 7-2 for sealing off. The inside of the reaction chamber 7 is provided with a heater consisting of a plurality of halogen lamps 11 and 11' and reflection plates 12 and 12' behind the lamps.

A plurality of substrates 1-1, 1-2, ... 1-n are mounted on the plurality of substrate holders 2-1, 2-2, ... 2-n. The distances 31-1, 31-2, ... between each adjacent holders in the reaction chamber 7 are selected substantially constant, the dispersion from the average being within ±20%. The corresponding distances in the loading chamber are selected more narrower for the purpose of designing the system compact. In this arrangement, only one side surface of each substrate is coated. If coating of both surfaces is desired, the substrates are supported in openings formed on the holders. Introduced to the reaction chamber 7 are a carrier gas of argon or hydrogen from the passage 10-1 of the gas feeding system, a reactive gas of a hydrocarbon such as methane or ethylene from the passage 60-2 and a halogen compound gas such as $NF_3$ from the passage 10-3. The pressure of the reactive gas is 0.001 to 1.0 Torr, e.g. 0.05 Torr. The substrate temperature is −100° C. (in case with a cooling system) or up to 150° C.

A first alternating voltage is applied between the mesh electrodes 3 and 3' at a high frequency of 1 MHz to 5 GHz, preferably 1 MHz to 50 MHz, e.g. 13.56 MHz while a second alternating voltage is applied between the midpoint of the secondary coil and the rails 9 at a frequency of 1 KHz to 500 KHz, e.g. 50 KHz. The input power of the first alternating voltage is 1.0 KW to 30 KW (equivalent to a plasma energy of 0.04-1.3 KW/cm$^2$), e.g. 10 KW (equivalent to a plasma energy of 0.44 W/cm$^2$). The second alternating voltage functions to apply a AC bias voltage of −200 to 600 V (equivalent to 500 W) at the substrate surface. By virtue of this electric power, a plasma gas is generated in the reaction chamber 7 and initiates chemical vapor reaction. The exhausted gas is removed through the evacuation system 20.

In operation of the apparatus, carbon coatings were deposited. First, argon gas was introduced into the reaction chamber at 0.05 Torr, followed by inputting high frequency energy between the mesh electrodes 3 and 3' at 110 KW from the power source 15 and between the transformer 16 and the substrate holders 2 in order to effect a sputtering action until the substrate temperature reached 100° to 500° C. Then, methane was continuously introduced in order that methane gradually substituted for and finally replaced all amount of argon. As a result, carbon coatings (amorphouns or crystals) were obtained. The Vickers Hardness was measured to be not lower than 2000 Kg/mm$^2$. The thermal conductivity was measured not lower than 2.5 W/cm deg. The deposition speed was 100 to 1000 Å/min, e.g. 100 to 200 Å/min. In the case of the deposition of coatings having a thickness of 1 micron at the centers of the substrates, disparity of the thickness was up to 10%. Also, phisical properties such as hardness were substantially uniform.

Next, the formation of a final coating on a silicon semiconductor wafer within which semiconductor devices are formed in order to difine a plurality of IC chips. After providing Al wiring on the wafer, a silicon oxide film is deposited to a thickness of 0.3 to 1 micrometer by use of the apparatus shown in FIGS. 1(A) and 1(B). A carbon coating is then deposited to a thickness of 0.1 to 1 micrometer on the oxide film. Furthermore, the upper surface of the carbon film is covered with an organic photo-resist pattern. Then, the carbon film and the silicon oxide film are selectively removed by use of HF etchant in order to expose the boding pads of the wiring. The organic resist is removed by oxygen or a suitable oxygen compound as an etchant.

The inside of the reaction chamber and the holders are inevitably coated by undesirable carbon depostion. After completion of the carbon coating of the substrates, the substrates are removed from the chamber. Then, NF$_3$ and argon gas are admitted at 0.05 Torr respectively to the chamber and energized into a plasma gas by inputting electric energy in the same manner as the deposition of carbon material to effect cleaning by virtue of plasma etching. This plasma etching may be carried out once for every coating or once after carrying out the deposition 3 to 5 times without cleaning, depending upon the thickness of the carbon films. The plasma etching for 15 munites can remove a 1 micrometer thick carbon coating.

The carbon elimination by use of fluorine plasma may be applied for patterning of carbon films which have been deposited as described in the above.

Figure 2:
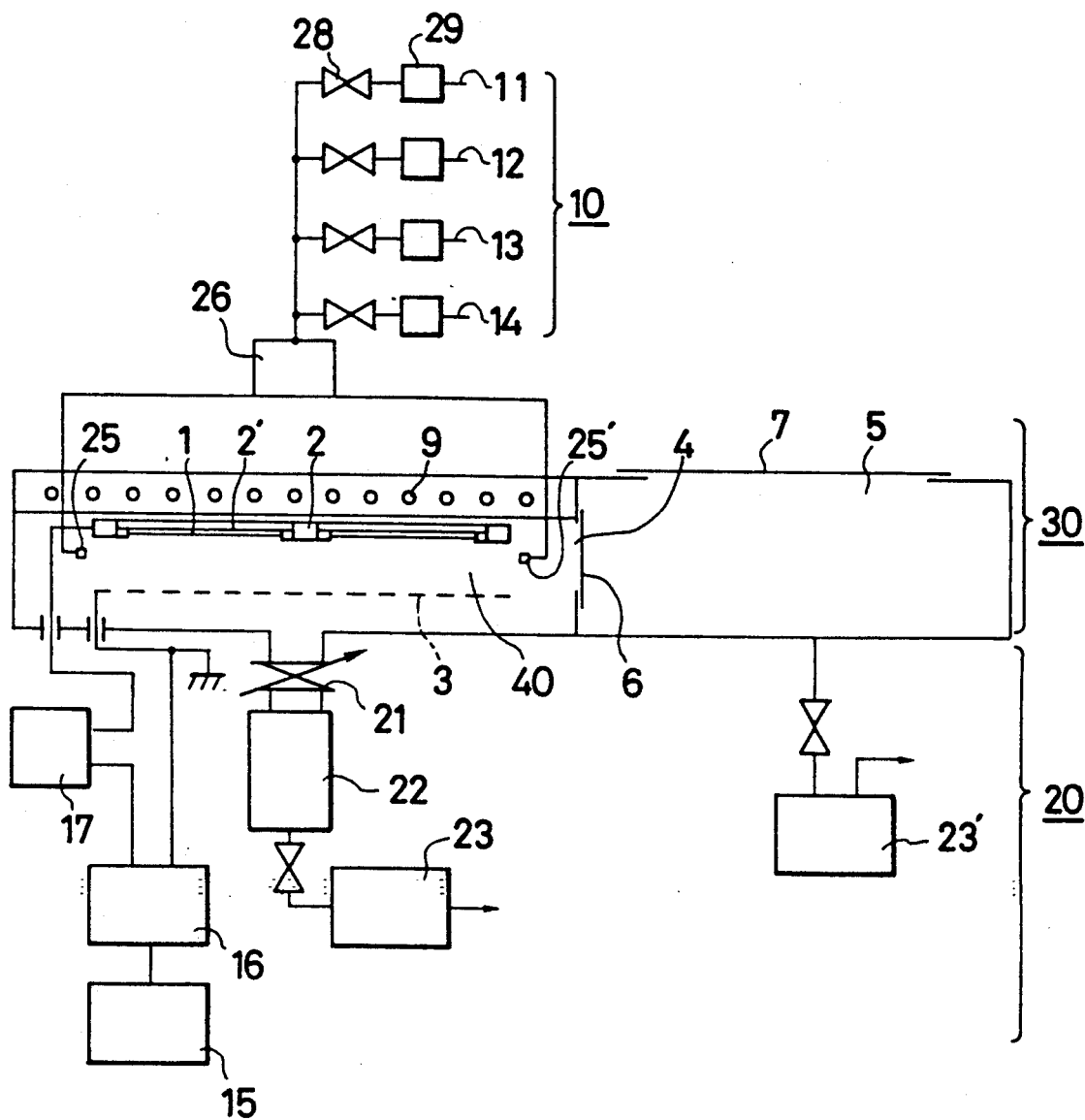
FIG. 2 is a cross section view showing another plasma CVD apparatus in accordance with the present invention.

Referring now to FIG. 2 showing another type of CVD apparatus, a carbon film deposition and etching method on a semiconductor substrate is explained in accordance with the present invention. The apparatus comprises a loading and unloading chamber 105, a reaction chamber 104 connected to the loading chamber 105 through a gate valve 106, a vacuum pump 123' provided for evacuating the loading chamber 105, a vacuum system provided for evacuating the reaction chamber 104 and consisting of a pressure control valve 121, turbo molecular pump 122 and a rotary pump 123, a gas feeding system 110 for introducing a process gas into the reaction chamber 104, a substrate holder 102 functioning also as an electrode, a mesh electrode 103 as the other electrode, a substrate temperature controlling device 109 and a high frequency electric energy supply connected between the substrate holder 102 and the mesh electrode 103 and consisting of a high frequency power source 115, a matching transformer 116 and a bias applying device 117. Optionally, a microwave excitation device 125 may be provided in association with the gas feeding system 110. For example, the device 125 energizes the reactive gas supplied from the gas feeding system 110 by microwaves at 2.45 GHz and 200 W to 2 KW. By use of this device 125, the deposition speed and the etching speed are increased about 5 times and about 4 times respectively.

A method of depositing carbon films will be described hereinbelow. Substrates to be coated are placed in the loading chamber 105. After evacuating the loading and reaction chamber 104 and 105, the substrates 101 are transferred to the reaction chamber 104 through the gate valve 106. A reactive gas is admitted to the reaction chamber 104 through the gas feeding system 110. The reactive gas includes a carbon compound gas such as CH$_4$, C$_2$H$_4$, C$_2$H$_2$, CH$_3$OH or C$_2$H$_5$OH. For example, H$_2$ and CH$_4$ are inputted through the line 111 and the line 112 respectively at a same rate.

A high frequency electric power is applied to the reactive gas from the high frequency power source 115 at 50 W to 1 KW. The power is equivalent to a plasma energy of 0.03 to 3 W/cm$^2$. The electric power applied between the substrates 101 and the mesh electrode 103 is biassed by −200 V to ±600 V. The actual bias potential at the substrates 101 is −400 to +400 V since a self bias voltage is spontaneously applied thereto even without the application of an external bias. When the deposition is carried out without the microwave power and a 100 to 300 V bias voltage is superimposed on the electric power, the deposition speed is 100 to 200 Å/min. When the deposition is carried out with the microwave power and a 100 to 300 V bias voltage is superimposed on the electric power, the deposition speed is 500 to 1000 Å/min. The pressure of the reactive gas is maintained at 1 to 0.01 Torr, e.g. 0.1 Torr in the reaction chamber 104. The substrate temperature is maintained at 150° to −100° C. by means of the device 109. As a result, there is deposited an amorphous carbon film on the substrates 101. The carbon film consists of an amorphous carbon which may contain, depending on the deposition condition, microcrystals of 5 to 200 Å diameter. The Vickers hardness of the carbon film is not lower than 2000 Kg/mm$^2$ and the thermal conductivity is not lower than 2.5 W/cm deg, preferably 4.0 to 6.0 W/cm deg. The carbon film is characterized by C—C bonds of sp$^3$. Exhausted gas is removed through the evacuating system 121 to 123.

An electric power at 1 GHz or a higher frequency, e.g. 2.45 GHz can break C—H bonds while C—C, C=C can be broken at 0.1 to 50 MHz, e.g. 13.56 MHz. The amount of hydrogen involved in the carbon films is preferably not higher than 50 mol%. Optionally, it is useful to add impurity such as phosphorus or boron in order to fabricate carbon n-type or p-type semiconductors.

After forming a mask on the carbon film, an etchant gas comprising fluorine is introduced into the reaction chamber 4. The etchant gas is for example $NF_3$ or $SF_6$. The plasma gas is generated in the same manner as in the depostion process. The substrate temperature is 100° to −100° C. during etching. The mask is removed by an etchant of, for example, $O_2$, air, $NO_2$, NO, $N_2O$, a mixture of oxygen and hydrogen, or some suitable oxygen compound. The pressure of the reactive gas is 0.01 to 1 Torr. Other films may be optionally formed underlying or overlying the carbon film. The formation of the other films and the mask may be carried out in the same chamber or different chambers. Several examples will be described in accordance with this embodiment in the followings.

EXAMPLE 1

Figure 3A:
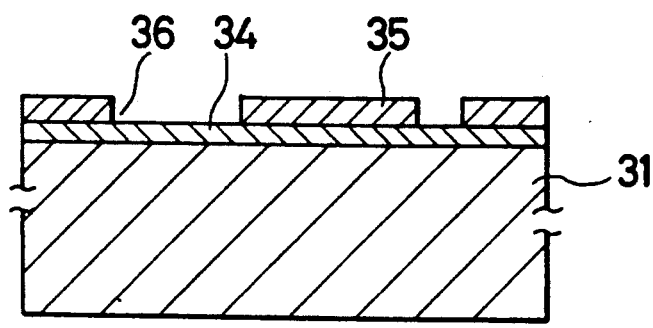
FIGS. 3(A) and 3(B) are cross sectional views showing a fabrication method of carbon patterns in accordance with the present invention.
Figure 3B:
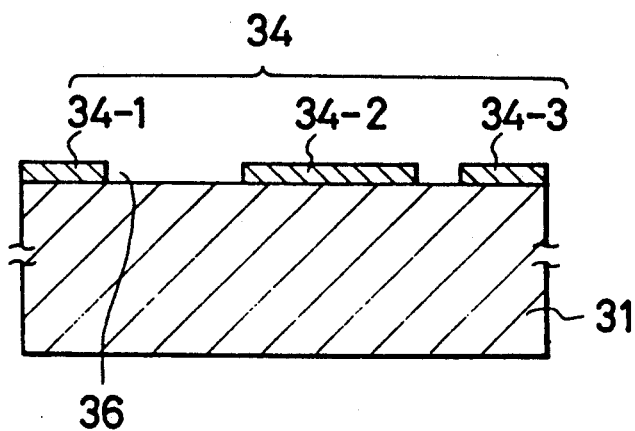

Reference is made to FIGS. 3(A) and 3(B). A carbon thin film pattern was formed on substrates made of a silicon semiconductor, a glass and a ceramic. A carbon film 134 was deposited on the substrate in accordance with the above method. Some surface portions of the carbon film was coated with a mask 135 corresponding to the prescribed pattern as shown in FIG. 3(A). The mask 35 was made of silicon oxide, silicon nitride, a photoresist or the like. The etchant was $NF_3$. The gas pressure was 0.1 Torr. The high frequency input power was 300 W. As a result, the carbon film was partially removed by etching at 350 Å/min. When the pressure was decreased to 0.05 Å/min, the etching rate reduced to 270 Å/min. Finally, the mask was removed by use of an etchant comprising oxygen and a carbon pattern 34 was obtained as illustrated in FIG. 3(B).

EXAMPLE 2

Figure 4A:
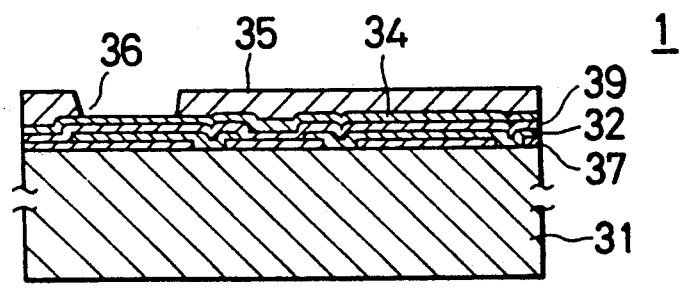
FIGS. 4(A) to 4(C) are cross sectional views showing a fabrication method of carbon patterns in accordance with the present invention.
Figure 4B:
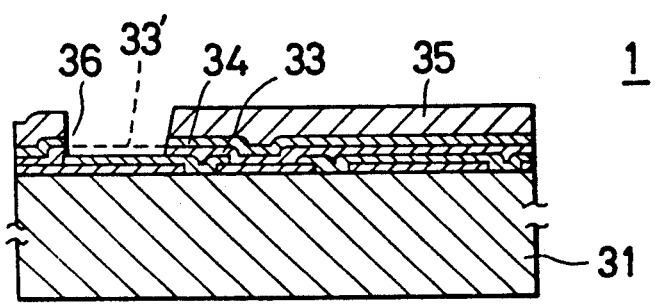
Figure 4C:
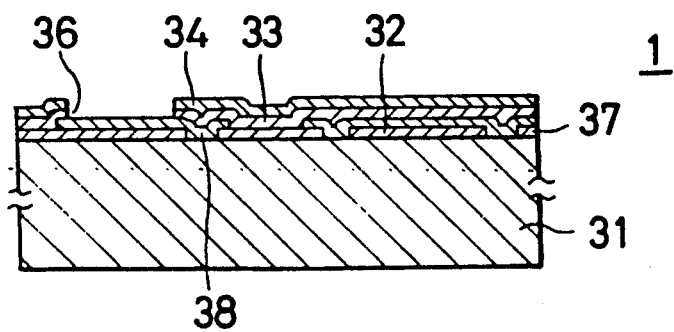

A semiconductor device using a carbon film pattern was produced. The process is explained in conjunction with FIGS. 4(A) to 4(C). The device was formed on a silicon semiconductor substrate 131. On the substrate, a silicon oxide film 137 and a superconducting ceramic film 132 were formed and patterned respectively, followed by coating of a 0.5 micron blocking film 133 for preveting current leakage since the resistivity of the carbon coatings was comparatively low ($10^8$ to $10^2$ ohm centimeter). It is effective to interleave a silicon oxide film having a resistivity of $10^{15}$ to $10^{17}$ ohm centimeter in order to insulate the carbon film from contacting the adjacent electrical connection. Then, a carbon film 134 was deposited on the structure to a thickness of 0.1 to 2 microns, e.g. 0.5 micron. A photoresist pattern was formed on the carbon film 134 with an opening 136. The opening 136 is a bonding pad for making contact with an IC chip. The thickness of the photoresist pattern was selected so that the underlying surface would be exposed even if the photoresist layer was decreased by the following etching.

Next, an etchant comprising fluorine was introduced to the reaction chamber and a high frequency power was inputted at 300 W to perform etching of the carbon film 134 and the underlying insulating film 134. After completion of the etching, the photoresist 135 was removed by ashing with an etchant comprising oxygen. Since the ashing is also effective to the carbon coating, it is recommended to cover the external surface of the carbon coating with an etching protection film such as a silicon oxide thin film.

Alternatively, the conductive film 132 may be formed of Al, Ag or a metallized Si. The blocking film 133 may be formed of a phosphosilicate glass. The thickness of the blocking film may be 0.1 to 1 micron in general. Instead of the thick photoresist pattern, a silicon oxide pattern may be formed by coating silicon oxide film and etching the same with a photo-resist. Silicon oxide does not suffer etching action from oxygen.

EXAMPLE 3

Figure 5:
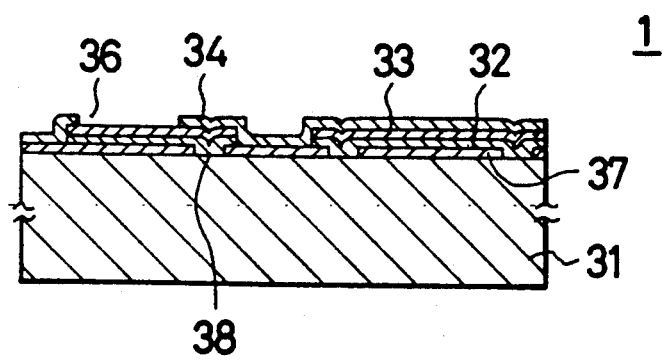
FIGS. 5, 6 and 7 are cross sectional views showing modifications of the embodiment illustrated in FIGS. 4(A) to 4(C).

This is a modified example of Example 2. In this example, the bloking film was made of a conductive material such as gold, platinum, cromium, a superconducting oxide material or silicon which was doped with impurity. The conductive pattern 132 was made of alminum, a metal silicate or silicon which was doped with impurity. Optionally, a final coating of carbon film may be formed over the structure. In the embodiment, the insulating film 133 and the underlying pattern 32 are formed to coincide with each other as shown in FIG. 5.

This structure is very usuful when applied for IC chips. The heat concentration can be reduced by virtue of the high thermal conductivity of the carbon film.

EXAMPLE 4

Figure 6:
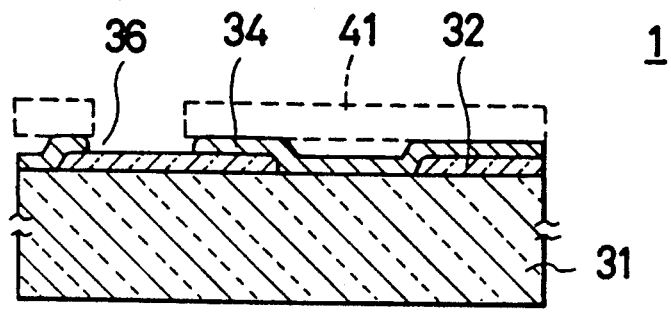
Figure 7:
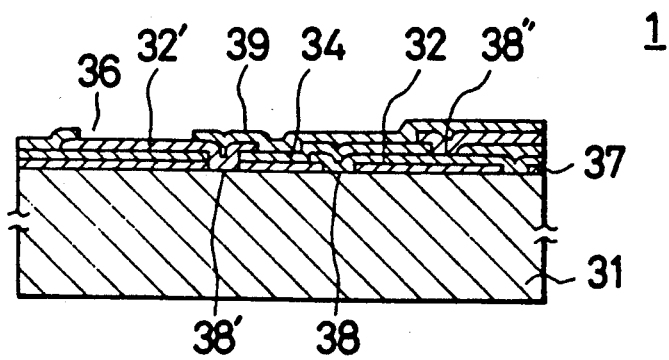

FIG. 6 is referred to. A conductive film 132 was deposited on a glass substrate or a glazed substrate and photoetched in order to produce electric wiring including pads for making contact with IC chips. A carbon film 134 was deposited to a thickness of 0.2 to 2 microns on the substrate over the pattern 132. The substrate may be provided with heating or sensor device thereon in general. Then, the carbon film 134 was etched with a stainless mask 141 of 150 to 500 microns thickness. This process is characterized by a decreased number of steps.

EXAMPLE 5

This was carried out substantially in accordance with the process of Example 2 except for the following differences. Reference is made to FIG. 6. In this example, a second carbon film 139 was formed and patterned as well as the carbon film pattern 134 in the same manner. Between the formations of the carbon film patterns 134 and 139, a second intervening electrode pattern 132' was formed by sputtering. The second electrode pattern 132' was prevented from making contact with other insulating films by the carbon films.

On the laminate pattern providing bonding pads and including the carbon films in accordance with the present invention, an IC chip is mounted and the whole structure is coated with a carbon film as a passivation film. The performance of the laminate pattern may be tested in advance of the mounting of the IC chip.

Superconducting ceraics for use in accordance with the present invention also may be prepared in consistence with the stoichiometric formulae $(A_{1-x}B_x)_y Cu_z O_w$, where A is one or more elements of Group IIIa of the Periodic Table, e.g. the rare earth elements, B is one or more elements of Group IIa of the Periodic Table, e.g. alkaline earth elements, and $x=0.1-1$; $y=2.0-4.0$, preferably 2.5–3.5; $z=1.0-4.0$, preferably 1.5–3.5; $w=4.0-10.0$, preferably 6.0–8.0. Also, superconducting ceramics for use in accordance with the present invention may be prepared consistent with the stoichiometric formulae $(A_{1-x}B_x)_y Cu_z O_w$, where A is one or more elements of Group Vb of the Periodic Table such as Bi, Sb, and As; B is one or more elements of Group IIa of the Periodic Table, e.g. alkaline earth elements, and x=0.3-1; y=2.0-4.0, preferably 2.5-3.5; z=1.0-4.0, preferably 1.5-3.5; w=4.0-10.0, preferably 6.0-8.0. Examples of the latter general formulae are $Bi_4Sr_yCa_3Cu_4O_x$, $Bi_4Sr_yCa_3Cu_4O_x$, $Bi_4Sr_yCa_3Cu_4O_x$, $Bi_4Sr_yCa_3Cu_4O_x$, $Bi_4Sr_yCa_3Cu_4O_x$, $Bi_4Sr_yCa_3Cu_4O_x$ (y is around 1.5).

The etching effect can be effected either isotropically or anisotropically by suitably arranging the etching conditions. In what follow, description is directed to this regards.

Figure 8:
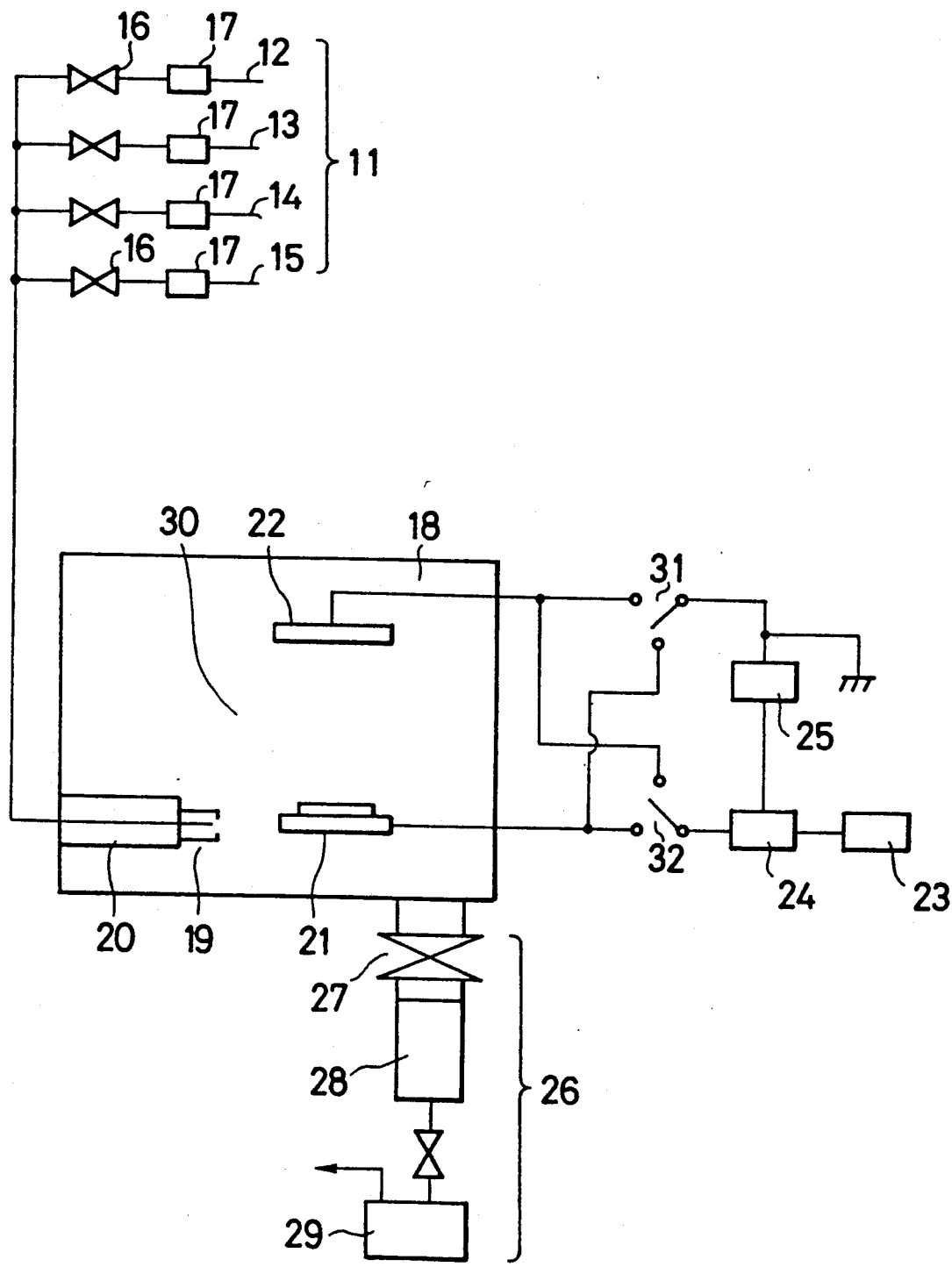
FIG. 8 is a cross section view showing a further plasma CVD apparatus in accordance with the present invention.

Referring to FIG. 8, there is shown a further plasma CVD apparatus for depositing and etching of carbon material on a surface in accordance with the teaching of the present invention. The surface to be coated may for example be made of semiconductor, glass, metal, ceramics, organic resins, magnetic substance and so forth.

The apparatus comprises a reaction chamber 218 defining a reaction space 230 therein, first and second electrodes 221 and 222, a high frequency electric power source 223 for supplying electric power between the electrodes 221 and 222 through a matching transformer 224, a DC bias source 215 connected in series between the electrodes 221 and 222, a gas feeding system 211 consisting of four passages 212 to 215 each of which is provided with a flow meter 217 and a valve 216, a microwave energy supply 220 for exciting gases from the feeding system 211, a nozzle 219 through which gas excited by the microwave energy supply 220 is introduced into the reaction space 230, and an exhaust system 226 including a pressure control valve 227, a turbomolecular pump 228 and a rotary pump 229. The electrodes are designed such that (the area of the first electrode 221)/(the area of the second electrode 222)<1. A pair of switching means 231 and 232 is provided for inverting the polarities of the electrodes 221 and 222. In a first position of the switching means, the electrode is grounded while the other electrode 221 is supplied with high frequency electric energy from the power source 223. In the other second position, the electrode 221 is grounded while the electrode 222 is supplied with high frequency electric energy from the power source 223. An object having the surface to be coated is mounted on the electrode 221.

In operation of this apparatus, a carrier gas of hydrogen is introduced to the reaction space 230 from the gas feeding passage 212 as well as a reactive gas of a hydrocarbon such as methane or ethylene from the gas feeding passage 213. The gas introduction rates of hydrogen and the hydrocarbon are equal. In addition to this, a V-Group dopant gas such as $NH_3$ or $PH_3$, or a III-Group dopant gas may be inputted to the reaction space 230 through the gas feeding passage 214 or 215 in order to form impurity semiconductors. Preexcitation may be effected by the microwave energy supply 210. The pressure in the reaction space is maintained within the range between 0.001 to 10 Torr, preferably 0.01 to 0.5 Torr. High frequency electric energy at a frequency not lower than 1 GHz, e.g. 2.45 GHz, is applied to the reactive gas at 0.1 to 5 kilo Watt for breaking C—H bonds. When the frequency is selected to be 0.1 to 50 MHz, C=C bonds can be broken and transformed to —C—C— bonds. By virtue of this reaction, carbon atoms are deposited atoms in the form of a structure in which the diamond structure occurs at least locally.

A bias voltage of, for example, −200 to 600 V is set at the DC bias source 215. The effective bias voltage level is substantially −400 to +400 V when a self bias level in this case of −200 V is spontaneously applied between the electrodes 221 and 222 with the bias voltage level of the source 215 being zero.

Generally, the high frequency input power is chosen between 10 Watt and 5 kilo Watt, preferably between 50 Watt and 1 kilo Watt. This input power corresponds to 0.03 to 3 Watt/cm$^2$ in terms of plasma energy. The substrate temperature is maintained in a range of +250° to −100° C. by means of a temperature control means (not shown). When diamond deposition is desired, the substrate temperature has to be elevated further.

There are two methods for changing the mode of etching (isotropic or anisotropic). The easier method of them is the change of the polarity of electric energy application at the substrate to be etched. When the electrode 210 supporting the substrate is grounded, the etching effect becomes isotropic since the etchant species are not particularly accelerated toward the substrate and the etching effect takes place mainly by virtue of the chemical reaction between the substrate and the etchant. On the other hand, when the electrode 210 is supplied with high frequency electric energy, the etchant species collide with the substrate and the etching action becomes effective particularly in the vertical direction.

The other method is based on the selection of the etchant gas. Etchant gas comprising fluorine such as $NF_3$ can produce fluorine excited species (ions or radicals) in plasma which are sufficiently reactive with the substrrate material to be etched so that even if the species are not given enough kinetic energy to collide with the substrate the etching reaction can take place. Another etchant gas, on the other hand, such as $H_2$ or $O_2$ is used to utilize the bias voltage between the electrode 11 and the substrate in order to allot kinetic energy to the species.

Figure 9:
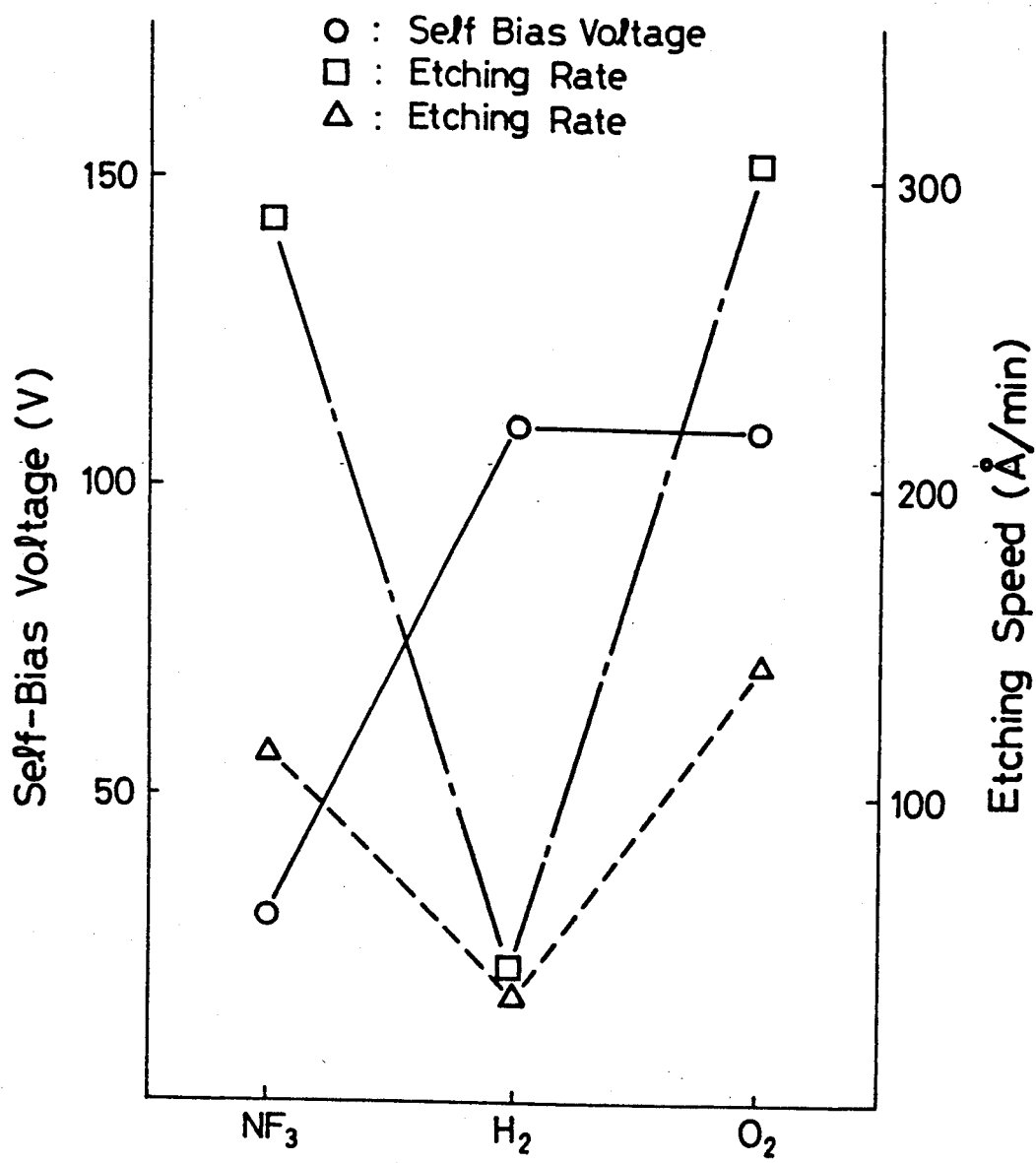
FIG. 9 is a graphical diagram showing the changes of the self-bias voltage depending upon the etching condition.

The self-bias voltage level is very important for the etching. FIG. 9 is a graphical diagram showing the self bias voltage (circular marks), the etching rate of carbon coating having a Vickers hardness of 1000 kg/mm$^2$ (rectangular marks), and the etching rate of carbon coating having a Vickers hardness of 2000 kg/mm$^2$ (triangle marks), respectively in cases using, as the etchant, $NF_3$, $H_2$ and $O_2$. The energy level of high frequency input power was 60 W. The introduction rate of the etchant was 50 SCCM. The substrate temperature was room temperature. The pressure in the reaction chamber was 3 Pa. As can be seen from the diagram, the self bias level in case using $NF_3$ was virtually low as compared with that in case using $H_2$ or $O_2$.

The $NF_3$ etchant can produce ions or radicals with which the substrate material reacts and is chemically removed while the $O_2$ or $H_2$ produce $O_+$ or $H_+$ which can phisically etch the substrate material. The self-bias in case using the $O_2$ or $H_2$ etchant can be reduced by adding a small amount of $NF_3$ as expected from FIG. 9 in order to prevent the damage to the substrate.

Figure 10:
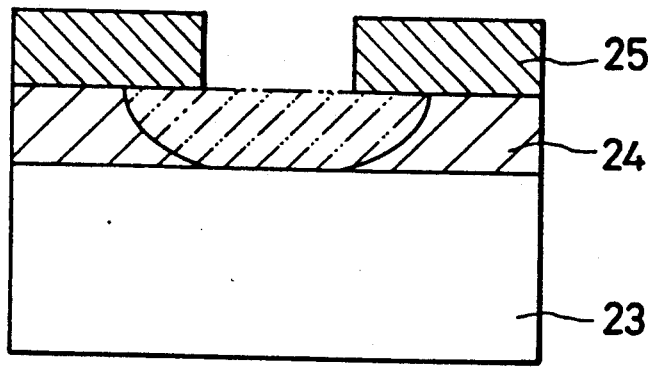
FIG. 10 is an explanational view showing an isotropic etching method.

Referring to FIG. 10, isotropic etching will be explained. A carbon coating 224 was deposited on a substrate 223 by use of the apparatus shown in FIG. 8 in accordance with the above description. The surface of the coating 224 was selectively covered with a organic resin mask 225 by photolithography or printing. After placing the substrate 223 in the apparatus, $NF_3$ was admitted at 100 SCCM to the reaction chamber at 0.01 to 1 Torr, e.g. 0.1 Torr. Then, etching was effected by inputting high frequency electric energy at 300 W. As a result, the carbon coating was isotropically etched at 350 Å/min. When the pressure was decreased to 0.05 Torr, the etching speed was reduced to 270 Å/min.

Figure 11:
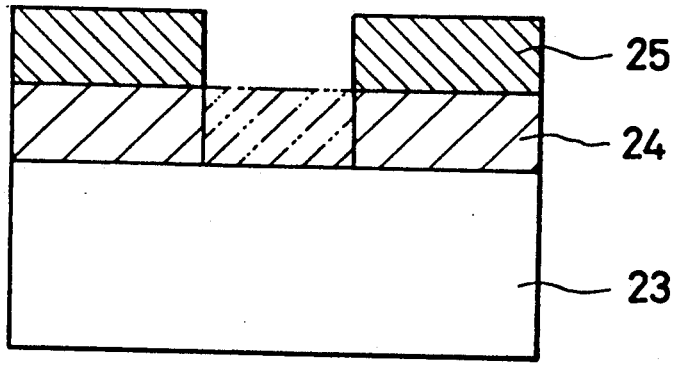
FIG. 11 is an explanational view showing an anisotropic etching method.

In the same manner, $H_2$ was introduced at 100 SCCM instead of $NF_3$ at 0.1 Torr and high frequency energy was inputted at 300 W. As a result, the carbon coating was anisotropically etched at 100 Å/min as illustrated in FIG. 11.

The two type of etchants can be used in combination. After depositing a carbon coating of 7000 Å thickness, etching was effected at 380 Å/min by introducing $H_2$ at 100 SCCM to 0.1 Torr and inputting electric energy at 400 W. When the etching reached to a depth of about 6000 Å, $NF_3$ was additionally introduced into the chamber in order to reduce the self-bias voltage and the etching of the 7000 Å thick coating was completed. The addition of $NF_3$ was effective for reducing the damage to the substrate surface.

Instead of the addition of $NF_3$, the reduction of the substrate damage can be accomplished by changing the polarity of the input energy. Namely, the etching was effected to a depth of about 6600 Å by introducing $H_2$ in the same manner as the previous paragraph under the condition that the electrode 210 was supplied with high frequency energy, and then the remaining 400 Å thickness was etched under the condition that the electrode 210 was grounded.

While a description has been made for several embodiments, the present invention should be limited only by the appended claims and should not be limited by the particular examles, and there may be caused to artisan some modifications and variation according to the invention. For example, it has been proved effective to add boron, nitrogen, phosphorus or the like into the carbon. Also, when carbon material is deposited, a halogen gas or halogen compound gas, in addition to a hydrocarbon, is introduced into the reaction chamber. Examples of halogen compound gases are fluorine compounds such as $NF_3$, $SF_3$ and $WF_6$, chlorine compounds such as $CCl_4$, bromine compounds such as $CH_3Br$ and iodine compounds. The carbon material formed in accordance with the present invention contains a halogen at 0.1–50 atom % which is controlled by adjusting the introduction rate of the halogen compound gas.

Generally, the substrates to be coated in accordance with the present invention include surfaces made of metals plastics, organic substances such as PET, PES, PMMA, teflon, epoxy, polyimide and the like, or superconducting ceramics such as $YBaCU_3O_{6-8}$ and $BiSrCaCu_yO_x$.

We claim:

1. An etching process of a carbon film formed on a substrate comprising the steps of:
   disposing said substrate with the carbon film in a reaction chamber;
   inputting an etchant gas selected from the group comprising of $H_2$ and $O_2$ into said reaction chamber;
   supplying an electrical energy to said etchant gas so that said etchant gas is excited;
   etching at least a portion of said carbon film by virtue of said excited etchant gas.

2. The process of claim 1 wherein a DC bias voltage is further inputted to the substrate so that the etchant gas is accelerated in the vicinity of the substrate.

3. The process of claim 2 wherein said etching process is an anisotropic etching.

4. The process of claim 1 wherein a mask having a prescribed patter is provided on said carbon film so that the carbon film can be patterned in accordance with said prescribed pattern.

* * * * *